(12) United States Patent
Venkatesa (10) Patent No.: US 8,278,927 B2
(45) Date of Patent: Oct. 2, 2012

(54) SYSTEM AND METHOD FOR CONTROLLING CURRENT IN GRADIENT COIL OF MAGNETIC RESONANCE IMAGING SYSTEM

(75) Inventor: Perumal Venkatesa, Tamill Nadu (IN)

(73) Assignee: General Electric Company, Schenectady, NY (US)

( * ) Notice: Subject to any disclaimer, the term of this patent is extended or adjusted under 35 U.S.C. 154(b) by 430 days.

(21) Appl. No.: 12/569,138

(22) Filed: Sep. 29, 2009

(65) Prior Publication Data

US 2011/0074413 A1    Mar. 31, 2011

(51) Int. Cl.
*G01V 33/00* (2006.01)
*G01R 33/44* (2006.01)

(52) U.S. Cl. ........ 324/322; 324/309; 324/317; 327/423; 363/90

(58) Field of Classification Search .......... 324/300–322; 363/90–91; 327/423
See application file for complete search history.

(56) References Cited

U.S. PATENT DOCUMENTS

| | | | |
|---|---|---|---|
| 4,344,123 A | 8/1982 | Bhagwat et al. | |
| 4,733,342 A | 3/1988 | Mueller et al. | |
| 5,270,657 A | 12/1993 | Wirth et al. | |
| 5,481,448 A | 1/1996 | Nakata et al. | |
| 6,051,975 A * | 4/2000 | Mori et al. | 324/322 |
| 6,353,354 B1 * | 3/2002 | Detweiler et al. | 327/423 |
| 2012/0057380 A1* | 3/2012 | Abe | 363/62 |

* cited by examiner

*Primary Examiner* — Melissa Koval
*Assistant Examiner* — Emily Chan (57) ABSTRACT

In one embodiment, a multilevel inverter for generating an AC output voltage, having at least seven potential levels, from a DC voltage source such that the generated AC voltage produces a current in a gradient coil of a magnetic resonance imaging system is provided. The multilevel inverter comprises an input voltage supply device configured for providing a divided DC voltage, at least eight switching arms for deriving the AC output voltages from the divided DC voltages, each of the switching arms comprising an input terminal receiving the divided DC voltage, a switching device controlling the AC output voltage and an output terminal providing the AC output voltage, at least four diodes, each of the four diodes connected to a single pair of switching arms, the four diodes forming a full bridge having positive and negative nodes, one of the nodes connected to the input voltage supply device and another node connected to the input terminals of the switching arms and a controller coupled to the input voltage supply device and the four diodes, the controller configured for producing plurality of control signals for controlling the AC output voltage.

10 Claims, 8 Drawing Sheets

| SWITCH STATE FOR SWITCH 206 | SWITCH STATE FOR SWITCH 208 | SWITCH STATE FOR SWITCH 210 | SWITCH STATE FOR SWITCH 212 | SWITCH STATE FOR SWITCH 214 | SWITCH STATE FOR SWITCH 216 | SWITCHING SECTOR | LOAD VOLTAGE |
|---|---|---|---|---|---|---|---|
| 0 | 0 | 0 | 0 | 1 | 1 | 3 | +V2+V1 |
| 0 | 0 | 0 | 1 | 0 | 1 | 2 | +V2 |
| 1 | 0 | 0 | 0 | 1 | 1 | 1 | +V1 |
| 1 | 0 | 0 | 1 | 0 | 1 | 1 OR 4 | 0 |
| 1 | 1 | 1 | 1 | 0 | 1 | 4 | -V1 |
| 1 | 0 | 1 | 1 | 0 | 0 | 5 | -V2 |
| 1 | 1 | 1 | 1 | 0 | 0 | 6 | -V2-V1 |

SYSTEM AND METHOD FOR CONTROLLING CURRENT IN GRADIENT COIL OF MAGNETIC RESONANCE IMAGING SYSTEM

FIELD OF INVENTION

The invention generally relates to a magnetic resonance imaging system and more particularly to high current, gradient power supplies for use in the magnetic resonance imaging system.

BACKGROUND OF THE INVENTION

MRI systems utilize gradient amplifiers for driving a gradient coil, which generates gradient fields. Such gradient fields are magnetic fields having a strength which varies linearly in a given co-ordinate direction in order to define the location for imaging to be formed by the MRI system by addition of this gradient field to a strong steady, uniform field. To this end, current pulses of an intensity of the order of magnitude of more than 600 A at a voltage of the order of magnitude of more than 1500 V are applied to the gradient coils, the rise time of the pulses being of the order of magnitude of 0.2 ms whereas the pulse duration is in the range of about 1 ms to 10 ms.

The magnetic field characteristic of the gradient coil, with respect to time, is generally of a trapezoidal shape, with very steeply sloping sides. For this reason, the current provided by the gradient amplifier to drive the gradient coil is desired to have a trapezoidal-shaped characteristic. There is a tendency towards shorter rise times with larger maximum currents so as to reduce the time required for the acquisition of MRI information for the formation of an MRI image; this offers advantages inter alia in respect of image sharpness and also in respect of imaging of moving objects. However, as the gradient coils exhibit an inductive behavior to the gradient amplifier, a higher voltage is required so as to achieve a shorter rise time of the pulses. Increasing the currents and the voltages to be supplied by the gradient amplifier, in combination with a shorter rise time, gives rise to problems concerning the electronic components in the gradient amplifier. Losses in the semiconductor components cause a significant development of heat, giving rise to cooling problems. These problems can be mitigated partly by using a switched inverter of the multilevel type (multilevel inverter).

One of the prior arts suggests using a HDx gradient amplifier topology for a high fidelity driver which is typical in the magnetic resonance imaging system. One limitation associated with such a topology is that the gradient amplifier comprises twelve switches and four capacitors at DC side making the gradient amplifier bulky and difficult to control.

Hence there exists a need for a simple, compact, efficient and reliable multilevel inverter that can be employed in the gradient amplifier of the MRI system.

BRIEF DESCRIPTION OF THE INVENTION

The above-mentioned shortcomings, disadvantages and problems are addressed herein which will be understood by reading and understanding the following specification.

In one embodiment, a multilevel inverter for generating an AC output voltage, having at least seven potential levels, from a DC voltage source such that the generated AC voltage produces a current in a gradient coil of a magnetic resonance imaging system is provided. The multilevel inverter comprises an input voltage supply device configured for providing a divided DC voltage, at least eight switching arms for deriving the AC output voltages from the divided DC voltages, each of the switching arms comprising an input terminal receiving the divided DC voltage, a switching device controlling the AC output voltage, and an output terminal providing the AC output voltage, at least four diodes, each of the four diodes connected to a single pair of switching arms, the four diodes forming a full bridge having positive and negative nodes, one of the nodes connected to the input voltage supply device and another node connected to the input terminals of the switching arms and a controller coupled to the input voltage supply device and the four diodes, the controller configured for producing plurality of control signals for controlling the AC output voltage.

In another embodiment, a magnetic resonance imaging system is provided. The magnetic resonance imaging system comprises a gradient amplifier for generating a magnetic gradient field in a measuring space of the magnetic resonance imaging system, a multilevel inverter for supplying the gradient amplifier with power signals in order to generate the magnetic gradient field, a transmitter configured for transmitting a radio-frequency pulse towards an object and a receiver configured for receiving a magnetic resonance echo signal from the object. Further, the multilevel inverter comprises a cascade of multilevel switching arms, each multilevel switching arm comprising an input terminal, an output terminal and a switching device coupled to the input terminal and the output terminal, an input voltage supply device coupled to the cascade of switching arms, the input voltage supply device configured for providing a divided DC voltage, at least four diodes connected to at least four switching arms, the four diodes forming a full bridge having positive and negative nodes, one of the nodes connected to the input voltage supply device and another node connected to the input terminals of the switching arms, a controller coupled to the input voltage supply device and the four diodes, the controller configured for producing plurality of control signals for controlling the AC output voltage.

In yet another embodiment, a method of controlling current in a gradient amplifier is provided. The method comprises sensing a gradient coil current, comparing the gradient coil current with a reference current, generating an error signal based on the comparison, processing the error signal to provide a voltage reference signal, generating a carrier signal based on the gradient coil current, generating a plurality of control signals based on the voltage reference signal and the carrier signal and selecting a switching sector based on the plurality of control signals, the switching sector corresponding to one or more fixed switch states and one or more variable switch states.

In yet another embodiment of the invention, a computer readable media comprising computer readable program instruction for controlling current in a gradient amplifier is described. The computer readable program instructions comprise a routine for sensing a gradient coil current, a routine for comparing the gradient coil current with a reference current, a routine for generating an error signal based on the comparison, a routine for processing the error signal to provide a voltage reference signal, a routine for generating a carrier signal based on the gradient coil current, a routine for generating a plurality of control signals based on the voltage reference signal and the carrier signal and a routine for selecting a switching sector based on the control signals, the switching sector corresponding to one or more fixed switch states and one or more variable switch states.

Systems and methods of varying scope are described herein. In addition to the aspects and advantages described in this summary, further aspects and advantages will become apparent by reference to the drawings and with reference to the detailed description that follows.

DETAILED DESCRIPTION OF THE INVENTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

Figure 1:
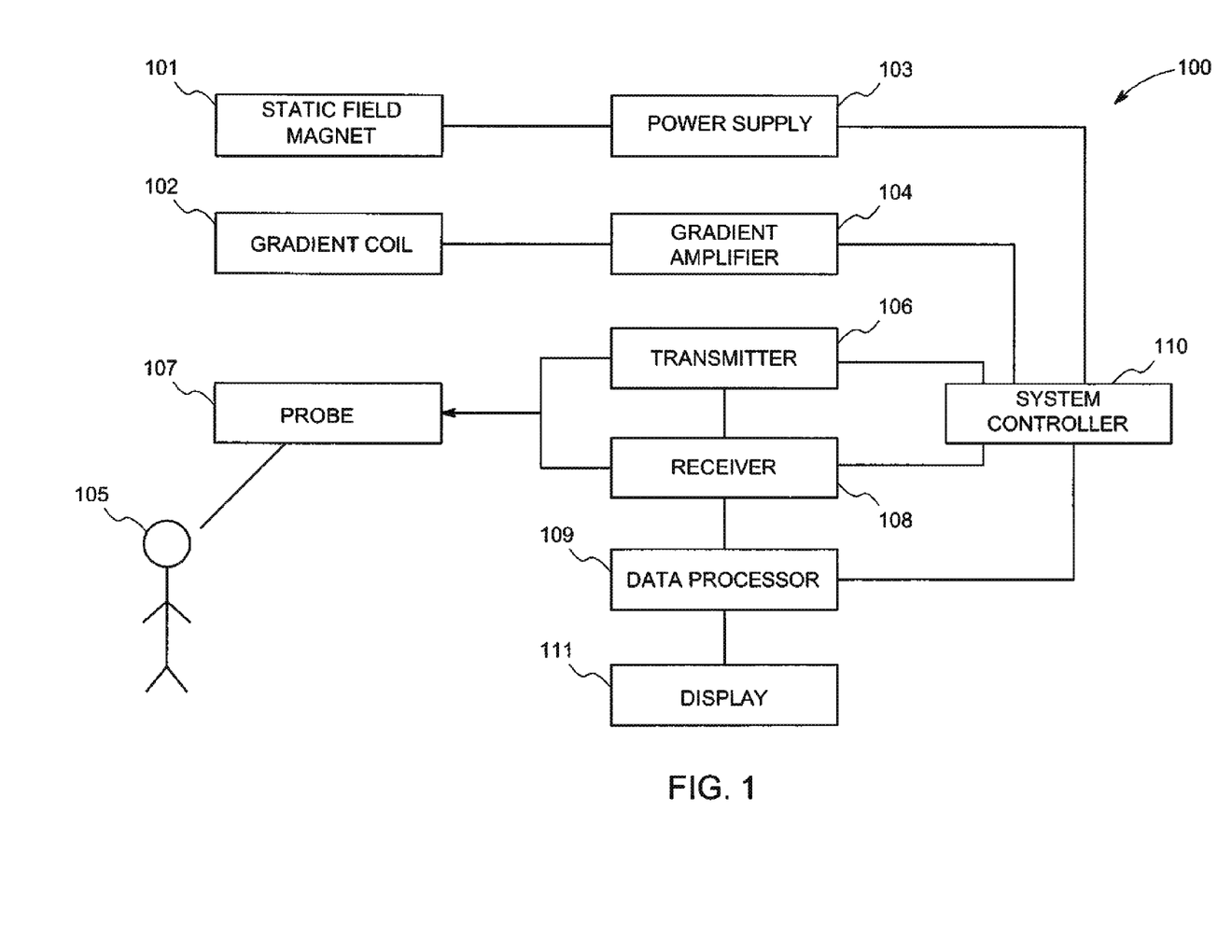
FIG. 1 is a block diagram showing an arrangement of an MRI system.

FIG. 1 is a block diagram showing an arrangement of an MRI system 100 in accordance with an embodiment of the invention. As shown in FIG. 1, a static field magnet 101 and a gradient coil 102 are respectively driven by a power supply 103 and a gradient amplifier 104. By using the static field magnet 101 and the gradient coil 102, a homogeneous static field and three types of gradient fields Gx, Gy, and Gz respectively having linear gradient field distributions in the same direction as that of the static field and in three orthogonal x, y, and z directions are applied to an object 105 to be examined. An RF signal is transmitted from a transmitter 106 to a probe 107. An RF field is then applied to the object 105 by the probe 107. The probe 107 may be constituted by a single probe unit for signal transmission and reception or by separate units for signal transfer and reception. An MR signal received by the probe 107 is detected by a receiver 108 and is subsequently transferred to a data processor 109. All of the power supply 103, the gradient amplifier 104, the transmitter 106, the receiver 108 and the data processor 109, are controlled by a system controller 110. In the data processor 109, the MR signals are processed to produce images of the object 105. The obtained image is then displayed on a display 111.

Figure 2:
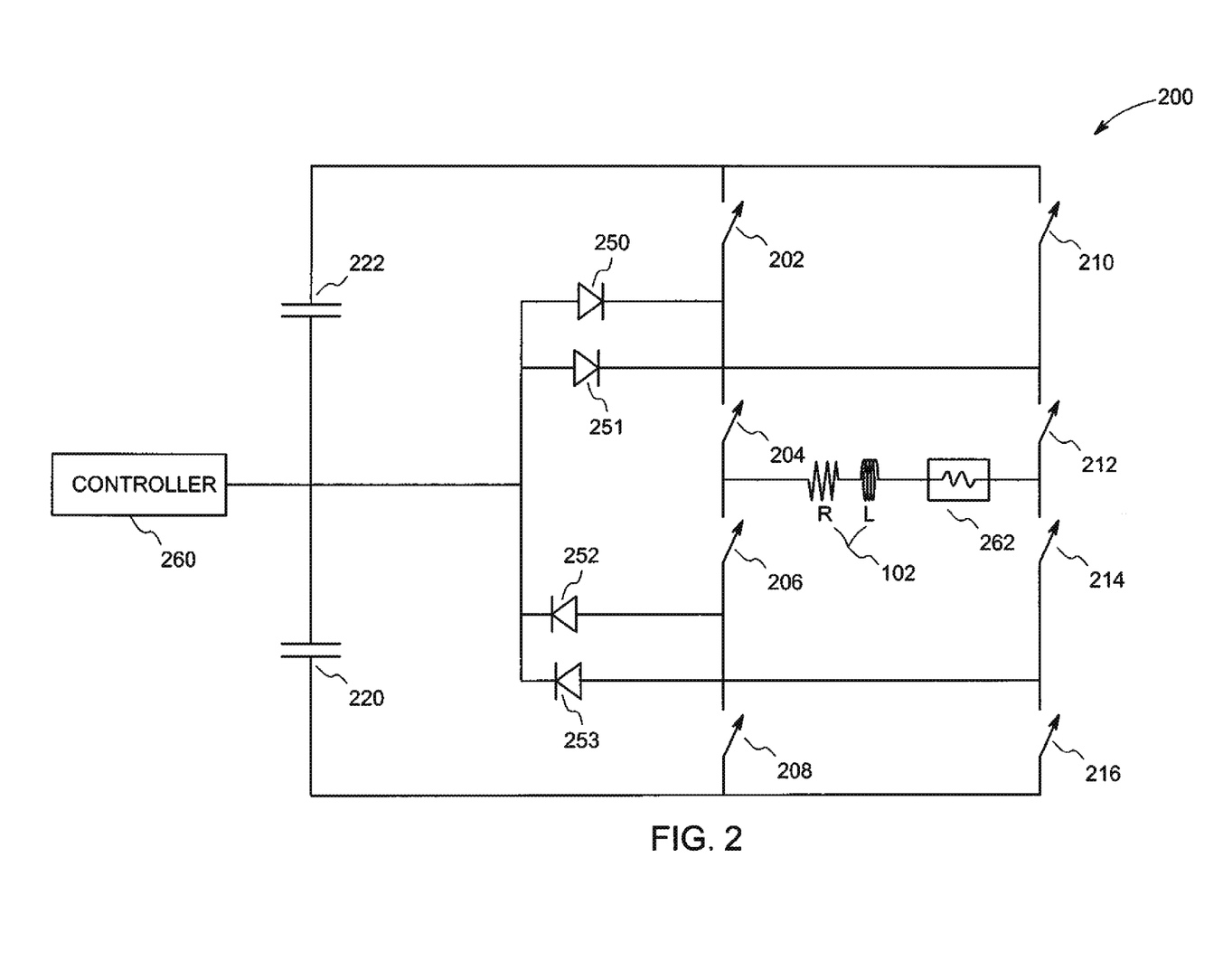
FIG. 2 shows a circuit diagram of seven level single-phase full bridge multilevel inverter for the MRI gradient amplifier application.

In one embodiment, a multilevel inverter for supplying the gradient amplifier 104 with power signals in order to generate the magnetic gradient field is provided. The multilevel inverter amplifies the RF signals that are applied to the gradient coil 102 by the gradient amplifier 104. FIG. 2 shows a circuit diagram of a seven level single-phase full bridge multilevel inverter 200.

In the MRI system 100, the multilevel inverter 200 is a part of the gradient amplifier 104. The output of the gradient amplifier 104 is connected to the gradient coil 102. The multilevel inverter 200 generates an AC output voltage having at least seven potential levels from a DC voltage source such that the generated AC voltage produces a current in the gradient coil 102 of the magnetic resonance imaging system 100. It can be noted from the gradient coil 102, shown in FIG. 2, that the gradient coil 102 is supplied with current in two directions. Accordingly, two identical sections are situated on either side of the gradient coil 102, such that the multilevel inverter 200 is formed by two half bridges.

In one embodiment of the invention, the resistance of the gradient coil 102 is approximately 0.3 ohm and the inductance of the gradient coil 102 is approximately 1.6 mH. Skilled artisans shall however appreciate that although the gradient coil 102 is modeled above as a simple inductance and resistance model, more complex models may readily be employed.

The multilevel inverter 200 comprises a cascade of multilevel switching arms 202-216. Each multilevel switching arm (also referred to as a switch) 202-216 comprises an input terminal, an output terminal and a switching device coupled to the input terminal and the output terminal. The input terminal is configured for receiving a divided DC voltage, the switching device is configured for controlling the AC output voltage and the output terminal is configured for providing the AC output voltage. The switching arms 202-216 are combined so as to form a cascade by connecting the output terminal of a preceding switching arm (for example, 204) to the input terminals of a subsequent switching arm (for example, 202).

In one embodiment, the cascade of multilevel switching arms 202-216 may be grouped into multiple pairs of switching arms for example 202 and 206, 204 and 208, 210 and 216, and 212 and 214. Further, each pair of switching arms 202 and 206, 204 and 208, 210 and 216, and 212 and 214 may comprise two switching devices complementing each other. For example, switching device of the switching arm 202 may complement switching device of the switching arm 206. Similarly, switching device of the switching arm 204 may complement switching device of the switching arm 208, switching device of the switching arm 210 may complement switching device of the switching arm 216 and switching device of the switching arm 212 may complement switching device of the switching arm 214.

With continued reference to FIG. 2 and in accordance with the above embodiment, the switching arm 202 may comprise a first switching device, the switching arm 204 may comprise a second switching device, the switching arm 210 may comprise a third switching device, the switching arm 212 may comprise a fourth switching device, the switching arm 206 may comprise a fifth switching device, the switching arm 208 may comprise a sixth switching device, the switching arm 216 may comprise a seventh switching device and the switching arm 214 may comprise an eighth switching device.

The multilevel inverter 200 further comprises an input voltage supply device coupled to the cascade of switching arms 202-216. The input voltage supply device is configured for providing the divided DC voltage. In one embodiment, the input voltage supply device comprises one input voltage source and a voltage dividing capacitor, the voltage dividing capacitor being configured for dividing an input voltage from the input voltage source into a divided DC voltage.

In an alternative embodiment, the input voltage supply device comprises two input voltage sources, a first input voltage source 220 and a second input voltage source 222.

Further, each of the input voltage sources 220 and 222 can comprise a battery. Thus, the D.C. voltage can be derived from a plurality of batteries or from a single battery with one or more capacitor dividers.

The multilevel inverter 200 further comprises at least four diodes 250-253 connected to four pairs of switching arms 202 and 206, 204 and 208, 210 and 216, and 212 and 214. The four diodes 250-253 form a full bridge having positive and negative nodes. One of the nodes is connected to the input voltage supply device 220 and 222, and another node is connected to the input terminals of the switching arms 202-216.

The multilevel inverter 200 further comprises a controller 260 coupled to the input voltage supply device 220 and 222, and the four diodes 250-253. The controller 260 is configured for producing plurality of control signals for controlling the AC output voltage.

For generating control signals, the current flowing through the gradient coil 102 (also called as load current) is sensed and used as a control parameter. For this reason, a current sensor 262 is coupled in series with the gradient coil 102. The current sensor 262 is configured for measuring a gradient signal, the gradient signal representing the current flowing through the gradient coil 102. The sensed current is compared with a reference current to generate an error signal. The controller 260 processes the error signal and provides a voltage reference signal "$V_{ref}^*$".

In one embodiment, the magnitude of the voltage reference signal ($V_{ref}^*$) thus generated is limited in the range of about −8 V to +8 V. The voltage reference signal thus generated can be divided into several predetermined ranges based on which the control signals can be generated. A first predetermined range represents the magnitude of the voltage reference signal within the range of about 0 V to about 1 V, a second predetermined range represents the magnitude of the voltage reference signal within the range of about 1 V to about 7 V, a third predetermined range represents the magnitude of the voltage reference signal greater than 7 V, a fourth predetermined range represents the magnitude of the voltage reference signal within the range of about −1 V to about 0 V, a fifth predetermined range represents the magnitude of the voltage reference signal within the range of about −7 V to about −1 V and a sixth predetermined range represents the magnitude of the voltage reference signal below −7 V.

The error signal represents the difference between the current through the gradient coil 102 and the desired current as indicated by the gradient signal. This error signal, after passing through a gain block (not shown), is input to the controller 260. The gain block (not shown) provides desired signal amplification and compensation to satisfy amplifier stability criteria such as are understood in the art. The controller 260 processes the error signal to provide first and second control signals. The control signals then control the voltage supplied by the input voltage sources 220 and 222 to provide a voltage output required to modify the current flow through the gradient coil 102 to reduce the error signal to zero. The error signal thus brings the current through the gradient coil 102 to the desired value reflected in the gradient signal.

The first input voltage source 220 and the second input voltage source 222 are coupled to the controller 260 and are driven by the control signals generated at the controller 260. Each of the input voltage sources 220 and 222 is capable of only three voltage outputs: zero volts and a predetermined voltage of either of two polarities. Each of the input voltage sources 220 and 222 receive an activation and polarity signal, which determines the polarity of the output voltage produced by each of the input voltage sources 220 and 222. The activation and polarity signal is indicated in the first and second control signal generated at the controller 260.

Further, the controller 260 may employ a differentiator (not shown), which receives the analog gradient signal (indicating the desired current through the gradient coil 102) and takes its derivative with respect to time. This derivative is multiplied by the impedance of the gradient coil 102 to produce an accelerating voltage representing the voltage that would have to be applied to the gradient coil 102 to achieve the change in current through the gradient coil 102 as dictated by the gradient signal.

This accelerating voltage is received by a two-step comparator (not shown), which produces polarity and activation signals for each of the switching arms 202-216. Switch logic coupled to the two-step comparator (not shown) interprets the positive and negative polarity signals into base driving signals for each of the switching arms 202-216 as depicted in Table 1 shown in FIG. 3. This is further explained in conjunction with FIG. 4.

A pulse width modulator (not shown) in the controller 260 responds to the gradient signal by controlling the switch states of each of the switching arms 202-216 to produce an appropriate voltage for the gradient coil 102. Each of the switching arms 202-216, are configured to be either turned on or turned off. Switching to a turned on or turned off state is controlled by a pulse width modulated (PWM) signal. Thus the output voltage of the multilevel inverter 200 is determined by the duty cycle of the PWM signal. In a similar manner to that described above by which the input voltage sources 220 and 222 are switched, the control signals are applied by the controller 260 to each of the switching arms 202-216.

The pulse width modulator (not shown) may be fashioned as a digital pulse width modulator to which digital input signals can be supplied and whose pulse-width-modulated control signals are based on the control signals of an analog pulse width modulator (not shown), such that the generated output stage voltages closely approximate analog curve.

Figure 4:
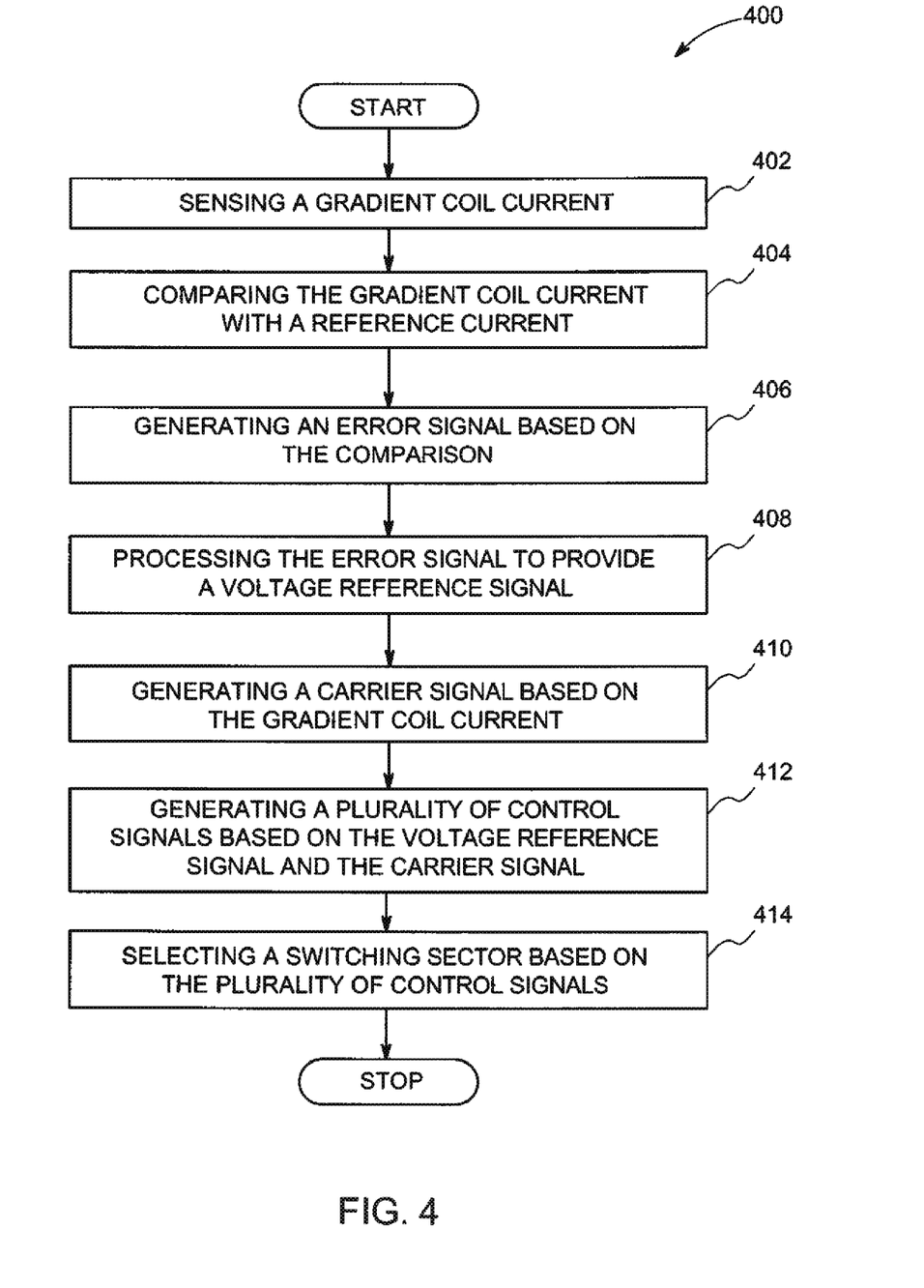
FIG. 4 shows a flow chart representing a method of controlling current in the gradient amplifier as described in one embodiment of the invention.

FIG. 4 shows a flow chart representing a method 400 of controlling current in the gradient amplifier 104 as described in another embodiment of the invention. The method 400 comprises steps of sensing a gradient coil current at step 402, comparing the gradient coil current with a reference current at step 404, generating an error signal based on the comparison at step 406, processing the error signal to provide a voltage reference signal at step 408, generating a carrier signal based on the gradient coil current at step 410, generating a plurality of control signals based on the voltage reference signal and the carrier signal at step 412 and selecting a switching sector based on the plurality of control signals at step 414.

Figure 3:
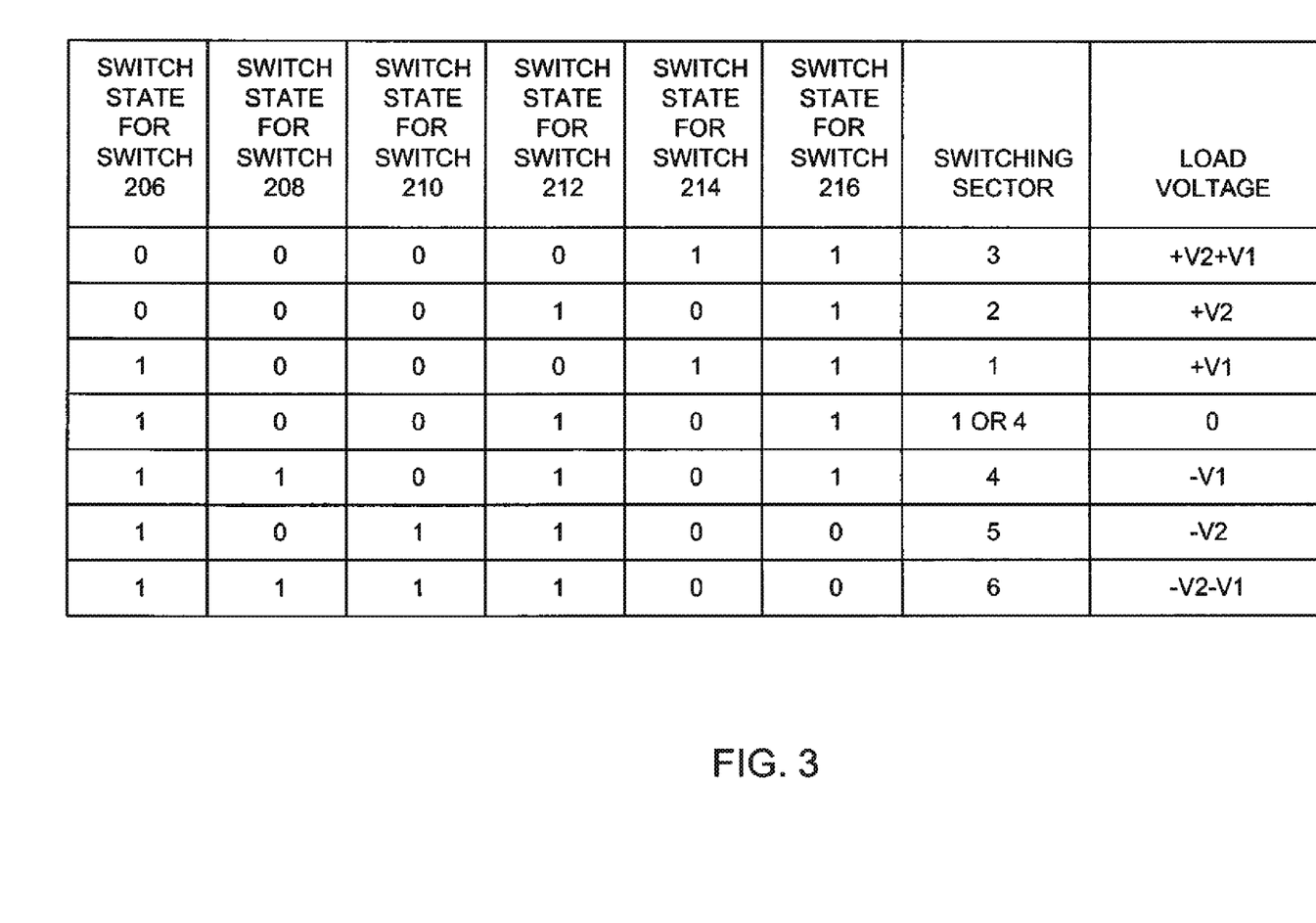
FIG. 3 shows a table representing different voltage levels in the single-phase full bridge multi level inverter shown in FIG. 2.

With continued reference to FIG. 3, Table 1 shown in FIG. 3 displays different output voltage levels corresponding to each switching sector (represented by a row). Further, each switching sector corresponds to one or more fixed switch states and one or more variable switch states.

Figure 5:
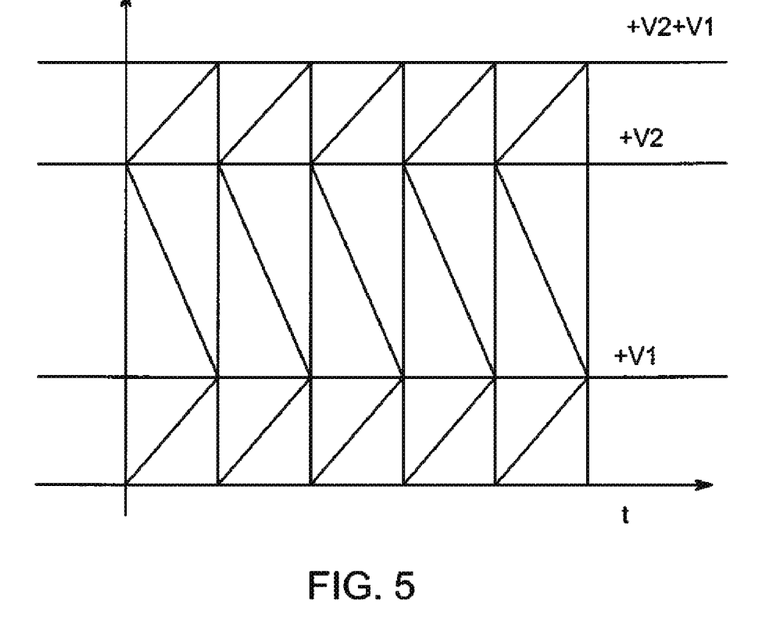
FIG. 5 and FIG. 6 show the carrier signal for various switching devices.
Figure 6:
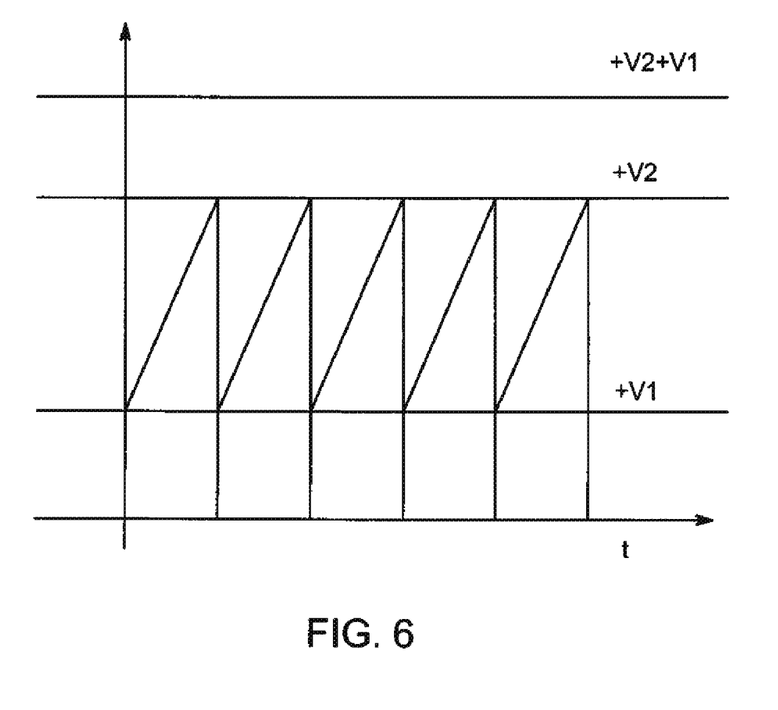

Each fixed switch state corresponds to one of a conducting and non-conducting state of a switching device. However, the variable switch state for any switching device may be generated by comparing the carrier signal with the voltage reference signal. The magnitude of the carrier signal varies with each switching sector whereas the frequency of the carrier signal is fixed approximately at 20 KHz. FIG. 5 shows the carrier signal for the switches 204, 208, 212 & 214 and FIG. 6 shows the carrier signal for the switches 202, 206, 210 & 216.

A first switching sector is selected when the magnitude of the voltage reference signal is in the range of about 0 V to about 1 V (first predetermined range). In the first switching sector, switches 204, 206 and 216 are turned "ON". The variable switch state for the switch 212 is generated by comparing the saw-tooth carrier waveform with the voltage reference signal. The peak magnitude of the saw-tooth carrier signal is 1 V with a positive slope. Further, it is to be noted that the switch state for the switch 212 is complement to that of the switch 214. Under this condition all other switches (202, 208 & 210) are turned "OFF".

A second switching sector is selected when the magnitude of the voltage reference signal is in the range of about 1 V to about 7 V (second predetermined range). In the second switching sector, switches 204 and 216 are turned "ON". The variable switch state for the switch 212 is generated by comparing the negative slope saw-tooth carrier wave with the voltage reference signal. It is to be noted that the switch state for the switch 212 is complement to that of the switch 214. Further, the variable switch state for the switch 206 is generated by comparing the positive slope saw-tooth carrier wave with the voltage reference signal. It is to be noted that the switch state for the switch 206 is complement to that of the switch 202. The magnitude of the saw-tooth carrier signal for the switches 212 and 206 varies between 1 V and 7 V. Under this condition all other switches (208 & switch 210) are turned "OFF".

A third switching sector is selected when the magnitude of the voltage reference signal is greater than 7 V (third predetermined range). In the third switching sector, switches 202, 204 and 216 are turned "ON" and the variable switch state for the switch 212 is generated by comparing the saw-tooth carrier wave with the voltage reference signal. The magnitude of saw-tooth carrier signal varies between 7 V and 8 V with a positive slope. It is to be noted that the switch state for the switch 212 is complement to that of the switch 214. Under this condition all other switches (206, 208 & 210) are turned "OFF".

A fourth switching sector is selected when the magnitude of the voltage reference signal is in the range of about −1 V to about 0 V (fourth predetermined range). During the selection of the fourth switching sector, switches 212, 216 and 206 are turned "ON". The variable switch state for the switch 204 is generated by comparing the saw-tooth carrier wave with an absolute value of voltage reference signal. The peak magnitude of saw-tooth carrier signal is 1 V with a positive slope. It is to be noted that the switch state for the switch 204 is complement to that of the switch 208. Under this condition all other switches (202, 210 & 214) are turned "OFF".

A fifth switching sector is selected when the magnitude of the voltage reference signal is in the range of about −7 V to about −1 V (fifth predetermined range). During the selection of the fifth switching sector, switches 206 and 212 are turned "ON". The variable switch state for the switch 204 is generated by comparing the negative slope saw-tooth carrier wave with an absolute value of voltage reference signal. It is to be noted that the switch state for the switch 204 is complement to that of the switch 208. Further, the variable switch state for the switch 216 is generated by comparing the positive slope saw-tooth carrier wave with the absolute value of voltage reference signal. It is to be noted that the switch state for the switch 216 is complement to that of the switch 210. The magnitude of the saw-tooth carrier signal for both the switches varies between 1 V and 7 V. Under this condition all other switches (202 & 214) are turned "OFF".

A sixth switching sector is selected when the magnitude of the voltage reference signal is less than −7 V (sixth predetermined range). During the selection of the sixth switching sector, switches switch 206, 210 and 212 are turned "ON". The variable switch state for the switch 204 is generated by comparing the saw-tooth carrier wave with an absolute value of voltage reference signal. It is to be noted that the switch state for the switch 204 is complement to that of the switch 208. The magnitude of saw-tooth carrier signal varies between 7 V and 8 V with a positive slope. Under this condition all other switches (214, 216 & 202) are turned "OFF".

In one embodiment, the single-phase full bridge multi level inverter 200 described herein can generate high precision current pulses though the gradient coil 102 with low switching losses. Although, the system may be simulated for different patterns of reference current waveforms, in one embodiment, the magnetic field characteristic of the gradient coil 102, with respect to time, is generally of a trapezoidal shape, with very steeply sloping sides. Accordingly, the current provided by the gradient amplifier 104 to drive the gradient coil 102 is desired to have a trapezoidal-shaped characteristic.

Figure 7:
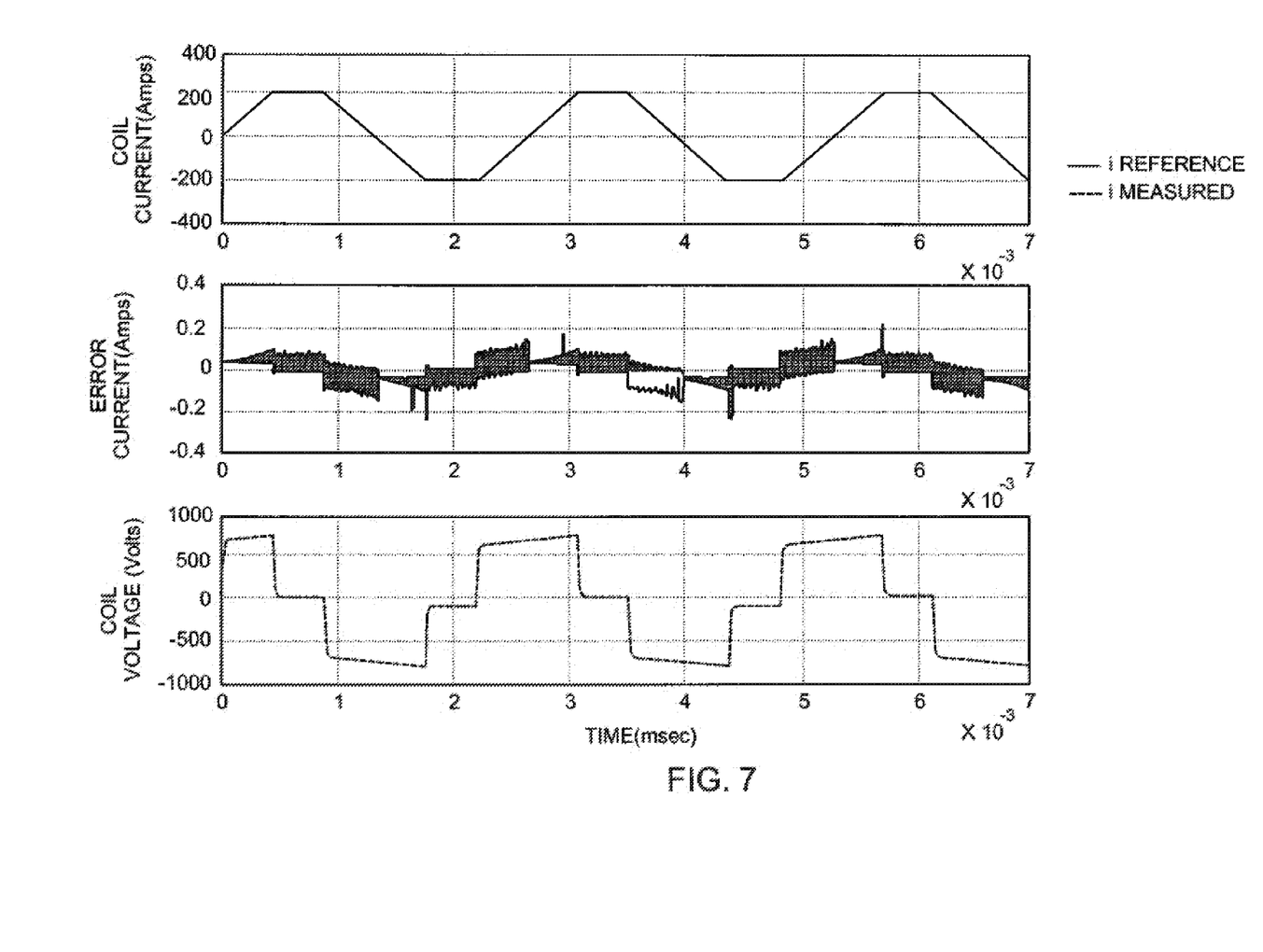
FIG. 7 demonstrates the performance of the gradient amplifier for a trapezoidal reference current.

In one exemplary embodiment, the first voltage component (V1) is selected to be 200 volts and the second voltage component (V2) is selected to be 700 volts. FIG. 7 demonstrates the performance of the system for a trapezoidal reference current with peak magnitude of 200 Amps at 440 us. Simulation result, shown in FIG. 7, of the single-phase full bridge multilevel inverter 200, shows three waveforms. A first waveform representing trapezoidal reference and measured current waveform, a second waveform representing current error and a third waveform representing voltage across the MRI gradient coil 102. The multilevel inverter 200 described herein provides approximately ±0.2 Amp. accuracy in the load current waveform. The amount of power lost is thus minimized and the ripple in the output signal of the gradient amplifier 104 becomes much smaller. This clearly demonstrates the performance of the multilevel inverter 200 described in the above embodiments.

Figure 8:
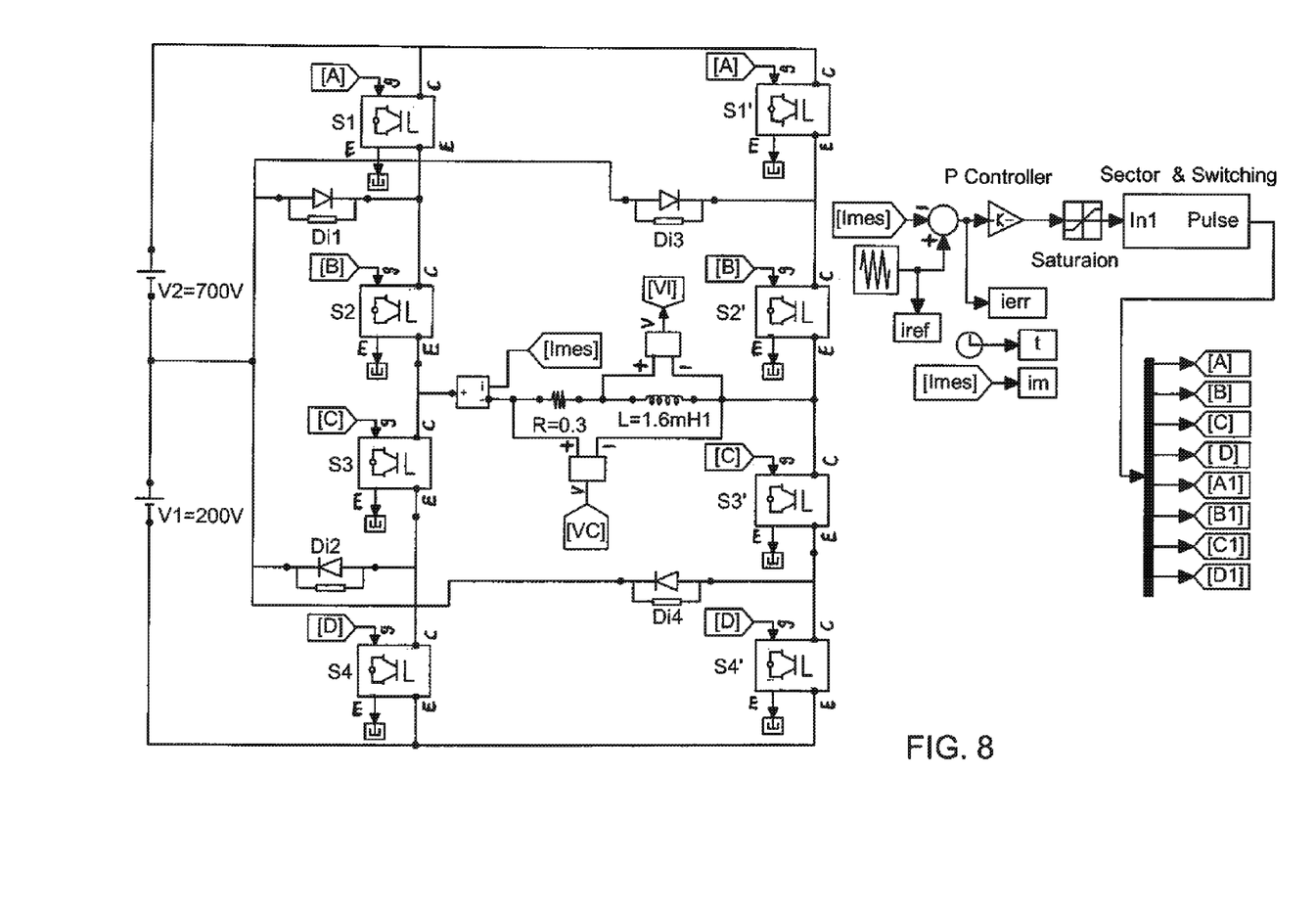
FIG. 8 and FIG. 9 depict MATLAB or simulink models for the single-phase full bridge multilevel inverter shown in FIG. 2.
Figure 9:
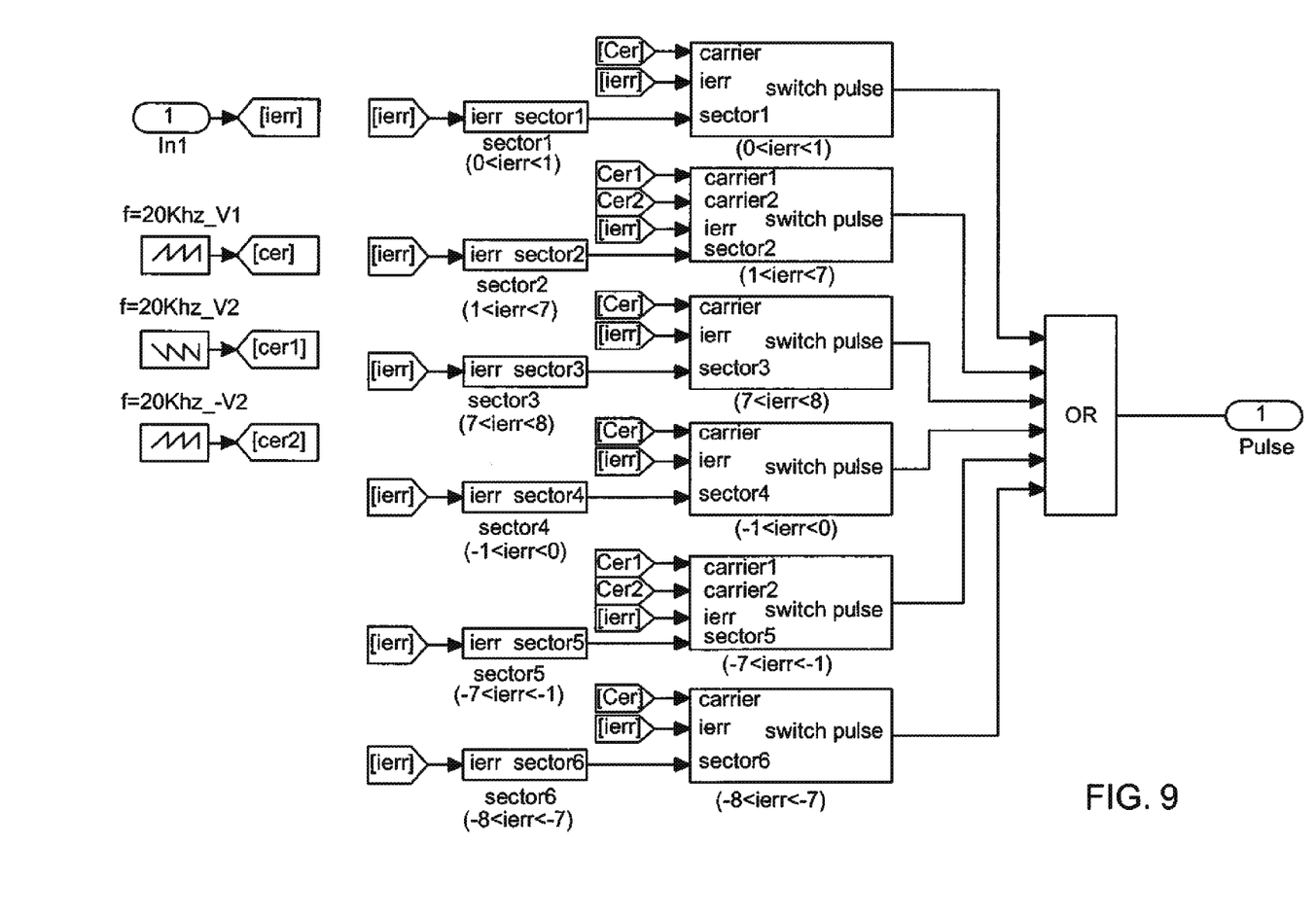

In one embodiment, the multilevel inverter 200 is programmed to execute control logic to control the AC output voltage generated at the multilevel inverter 200. The control and switching logic may be implemented in the multilevel inverter 200 using MATLAB/Simulink software. Accordingly, FIG. 8 and FIG. 9 depict MATLAB or simulink models for the single-phase full bridge multilevel inverter 200 shown in FIG. 2.

The control logic to control the AC output voltage generated at the multilevel inverter 200 may be provided in the form of computer instructions. Accordingly, in one embodiment, a computer readable media comprising computer readable program instructions for controlling current in the gradient amplifier 104 is provided. The computer readable program instructions comprise a routine for sensing a gradient coil current, a routine for comparing the gradient coil current with a reference current, a routine for generating an error signal based on the comparison, a routine for processing the error signal to provide a voltage reference signal, a routine for generating a carrier signal based on the gradient coil current, a routine for generating plurality of control signals based on the voltage reference signal and the carrier signal and a routine for selecting a switching sector based on the control signals.

Some of the advantages of the system and method described herein are listed below.

The control logic employed in the multilevel inverter described herein is simple and easy to implement. Further, the number of switching arms used in the multilevel inverter is decreased to eight when compared to a large number of switching arms employed in the multilevel inverter described in the art.

The multilevel inverter provides seven AC output voltage levels while handling fast transient current pulses with a high precision and low switching loss thereby providing greater accuracy in the current waveform delivered across the gradient coil.

The multilevel inverter when incorporated in a high fidelity amplifier may reduce the cost of the high fidelity amplifier.

The system and method described herein highly enlarge the diagnostic target and improve the image quality of ultra-high-speed MRI scanning.

In various embodiments of the invention, a multilevel inverter for a magnetic resonance imaging system and a magnetic resonance imaging system using a multilevel inverter are described. However, the embodiments are not limited and may be implemented in connection with different applications. The application of the invention can be extended to other areas, for example power amplifiers. The invention provides a broad concept of using a multi level inverter to provide multiple AC output voltages, which can be adapted in a similar power amplifier. The design can be carried further and implemented in various forms and specifications.

This written description uses examples to describe the subject matter herein, including the best mode, and also to enable any person skilled in the art to make and use the subject matter. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A multilevel inverter for generating an AC output voltage from a DC voltage source such that the generated AC voltage produces a current in a gradient coil of a magnetic resonance imaging system, the multilevel inverter comprising:
    an input voltage supply device configured for providing a divided DC voltage;
    at least eight switching arms for deriving the AC output voltages from the divided DC voltages, each of the switching arms comprising an input terminal receiving the divided DC voltage, a switching device controlling the AC output voltage, and an output terminal providing the AC output voltage;
    at least four diodes, each of the four diodes connected to a single pair of switching arms, the four diodes forming a full bridge having positive and negative nodes, one of the nodes connected to the input voltage supply device and another node connected to the input terminals of the switching arms; and
    a controller coupled to the input voltage supply device and the four diodes, the controller configured for producing plurality of control signals for controlling the AC output voltage.

2. The multilevel inverter of claim 1, wherein the input voltage supply device comprises one input voltage source, and a voltage dividing capacitor, the voltage dividing capacitor configured for dividing an input voltage from the input voltage source.

3. The multilevel inverter of claim 1, wherein the input voltage supply device comprises two input voltage sources, a first input voltage source having an input for receiving a first control signal and configured for producing a first voltage component in response to the first control signal and a second input voltage source having an input for receiving a second control signal and configured for producing a second voltage component in response to the second control signal.

4. The multilevel inverter of claim 1, wherein the AC output voltage has seven potential levels.

5. The multilevel inverter of claim 1, further comprising a current sensor coupled to the gradient coil, the current sensor configured for measuring a gradient signal, the gradient signal representing the current flowing through the gradient coil.

6. A magnetic resonance imaging system comprising:
    a gradient amplifier for generating a magnetic gradient field in a measuring space of the magnetic resonance imaging system;
    a multilevel inverter for supplying the gradient amplifier with power signals in order to generate the magnetic gradient field, wherein the multilevel inverter comprises:
        a cascade of multilevel switching arms, wherein each multilevel switching arm comprises:
            an input terminal and an output terminal; and
            a switching device coupled to the input terminal and the output terminal, wherein the cascade of the switching arms is formed when the output terminal of a preceding switching device is coupled to the input terminal of a succeeding switching device;
        an input voltage supply device coupled to the cascade of switching arms, the input voltage supply device configured for providing a divided DC voltage;
        at least four diodes connected to at least four switching arms, the four diodes forming a full bridge having positive and negative nodes, one of the nodes connected to the input voltage supply device and another node connected to the input terminals of the switching arms; and
        a controller coupled to the input voltage supply device and the four diodes, the controller configured for producing plurality of control signals for controlling the AC output voltage;
    a transmitter configured for transmitting a radio-frequency pulse toward an object; and
    a receiver configured for receiving a magnetic resonance echo signal from the object.

7. The imaging system of claim 6, wherein the cascade of multilevel switching arms are grouped into multiple pairs of switching arms and wherein each pair of switching arms comprise two switching devices complementing each other.

8. The imaging system of claim 6, wherein the input voltage supply device comprises one input voltage source, and a voltage dividing capacitor, the voltage dividing capacitor configured for dividing an input voltage from the input voltage source.

9. The imaging system of claim 6, wherein the input voltage supply device comprises two input voltage sources, a first input voltage source having an input for receiving a first control signal and configured for producing a first voltage component in response to the first control signal and a second input voltage source having an input for receiving a second control signal and configured for producing a second voltage component in response to the second control signal.

10. The imaging system of claim 6, wherein the AC output voltage has seven potential levels.

* * * * *